United States Patent
Deogun et al.

(10) Patent No.: US 7,088,141 B2
(45) Date of Patent: Aug. 8, 2006

(54) MULTI-THRESHOLD COMPLEMENTARY METAL-OXIDE SEMICONDUCTOR (MTCMOS) BUS CIRCUIT AND METHOD FOR REDUCING BUS POWER CONSUMPTION VIA PULSED STANDBY SWITCHING

(75) Inventors: Harmander Singh Deogun, Lincoln, NE (US); Kevin John Nowka, Georgetown, TX (US); Rahul M. Rao, Ann Arbor, MI (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/965,106

(22) Filed: Oct. 14, 2004

(65) Prior Publication Data

US 2006/0082384 A1  Apr. 20, 2006

(51) Int. Cl.
*H03K 19/0175* (2006.01)
*H03K 19/082* (2006.01)
*H03M 5/08* (2006.01)
*H03M 3/00* (2006.01)

(52) U.S. Cl. ............................ 326/82; 326/89; 326/90; 341/53; 341/143

(58) Field of Classification Search ................. 326/82, 326/89–90; 341/53, 143
See application file for complete search history.

(56) References Cited

U.S. PATENT DOCUMENTS 4,313,224 A * 1/1982 Wakabayashi et al. ........ 398/16
4,586,186 A * 4/1986 Anderson .................... 375/211
5,282,074 A * 1/1994 Miyazaki et al. ............. 398/26

OTHER PUBLICATIONS

Mutoh, et al., 1-V Power Supply High-Speed Digital Circuit Technology with Multithreshold-Voltage CMOS, IEEE JSSC Issue V 30, # 8, 1995, USA, no month.
Victor, et al., Bus Encoding to Prevent Crosstalk Delay, IEEE ICCAD 2001, no month.

* cited by examiner

*Primary Examiner*—Rexford Barnie
*Assistant Examiner*—Jason Crawford
(74) *Attorney, Agent, or Firm*—Mitch Harris, Atty at Law, LLC; Andrew M. Harris; Casimer K. Salys

(57) ABSTRACT

A multi-threshold complementary metal-oxide semiconductor (MTCMO) bus circuit reduces bus power consumption via a reduced circuit leakage standby and pulsed control of standby mode so that the advantages of MTCMOS repeater design are realized in dynamic operation. A pulse generator pulses the high-threshold voltage power supply rail standby switching devices in response to changes detected at the bus circuit inputs. The delay penalty associated with leaving the standby mode is overcome by reducing cross-talk induced delay via a cross-talk noise minimization encoding and decoding scheme. A subgroup of bus wires is encoded and decoded, simplifying the encoding, decoding and change detection logic and results in the bus subgroup being taken out of standby mode only when changes occur in one or more of the subgroup inputs, further reducing the power consumption of the overall bus circuit.

20 Claims, 5 Drawing Sheets

MULTI-THRESHOLD COMPLEMENTARY METAL-OXIDE SEMICONDUCTOR (MTCMOS) BUS CIRCUIT AND METHOD FOR REDUCING BUS POWER CONSUMPTION VIA PULSED STANDBY SWITCHING

This invention was made with Government support under TRIPS-2; Subcontract UTA03-452 of DARPA prime contract F33615-030C-4106. THE GOVERNMENT HAS CERTAIN RIGHTS IN THIS INVENTION.

BACKGROUND OF THE INVENTION

1. Technical Field

The present invention relates generally to bus circuits, and more particularly to an MTCMOS bus circuit and operating method for reducing power consumption by a bus circuit.

2. Description of the Related Art

Low power electronic systems incorporating large parallel buses are increasingly prevalent, as microprocessor systems are used in notebook computers, personal digital assistants (PDAs) and other electronic appliances designed for portable battery-operated use.

A large portion of the quiescent power consumption of such systems in "standby" or other low-power modes is now determined by the quiescent "off-state" leakage of the bus repeater devices and gate tunneling at the input of the devices, as the repeaters are used in increasing quantities. The increased number of repeaters are needed to reduce the effects of increased wire capacitance and resistance as bus frequencies are increased and as the inter-wire spacing is reduced due to device scaling.

Therefore, as the number of bus repeaters increases, the percentage of standby power consumption due to the above-mentioned leakage is increasing, and is becoming the dominant portion of the total system standby power consumption.

One architecture that has been implemented for reducing quiescent power consumption in buses is Multi-Threshold Complementary Metal-Oxide Semiconductor (MTCMOS) architecture. The MTCMOS architecture isolates the power supply rails of the CMOS bus repeaters by using higher threshold voltage devices as power rail "header" and "footer" standby switching devices feeding common internal "virtual supply" rails. The use of higher threshold voltage devices decreases the off-state leakage and gate tunneling effects that otherwise increase power consumption when the repeaters are not switching. However, an area penalty is generated by the additional devices, so for practical purposes, many repeaters must share a common set of standby switching devices. Also, the virtual supply rails must be fairly short (and thus the devices connected to the virtual supply rails must be fairly local), or a penalty is incurred in routing the virtual supply rails—especially if scarce upper layer metal resources are used.

As the bus repeaters are typically disposed between parallel bus segments separated by the repeaters), localized groupings of the repeaters are generally a group of repeaters that drive a given group of bus segments, one for each of the bitlines, it is generally more practical to share the standby switching devices among a given set of repeaters for each bit line. However, the standby signal that controls the standby switching devices must be routed to each of the switching devices and the delay time for recovery from the standby state (i.e., the time needed for the virtual power supply rails to stabilize after the standby switching devices are turned on) typically limits the use of the standby mode to coarse intervals. Thus, the standby mode is entered only when a long interval of inactivity is expected, limiting the amount of power reduction that can be accomplished. Further, due to the use of the virtual power supply rails across the set of bitlines, the virtual power supply rails must have sufficient capacitance to handle worst-case switching loads for each repeater on the bus combined, increasing the delay penalty associated with leaving the standby mode.

Further, if finer control of the standby mode of an MTCMOS bus repeater were possible, a control mechanism would be needed to control the standby mode, not from the typical global or local block device power mode signal as is commonly used in battery-operated circuits, but a dynamic control mechanism that can control the standby mode in response to bus activity.

Therefore, it would be desirable to provide an MTCMOS architecture such that a finer interval may be used to enter and exit standby mode so that bus power consumption due to leakage can be reduced. It would further be desirable to provide a control mechanism such that the standby mode for a set of bus repeaters can be controlled on-the fly.

SUMMARY OF THE INVENTION

The objectives of reducing bus power consumption by reducing the MTCMOS standby interval and providing a control mechanism for on-the-fly control of standby mode are accomplished in a method and apparatus.

A pulse generator generates a pulse that enables the standby power switching devices of the MTCMOS repeaters as it propagates along the bus, thereby enabling each repeater as it is required to transmit its corresponding bus signal. The pulse generator detects when a change has occurred at the bus inputs and the pulse is generated when the change has been detected, thus only enabling the repeaters when the bus state changes. The pulse may be held for a predetermined number of clock cycles after the change is detected, preventing continual switching of the repeaters from standby to non-standby mode when bus activity is high.

The bus can be split into subgroups, simplifying the change detection circuit, and cross-talk reducing bus encoding and decoding for each subgroup or the bus can be employed to increase the delay slack to accommodate the delay associated with bringing the repeaters out of standby mode.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
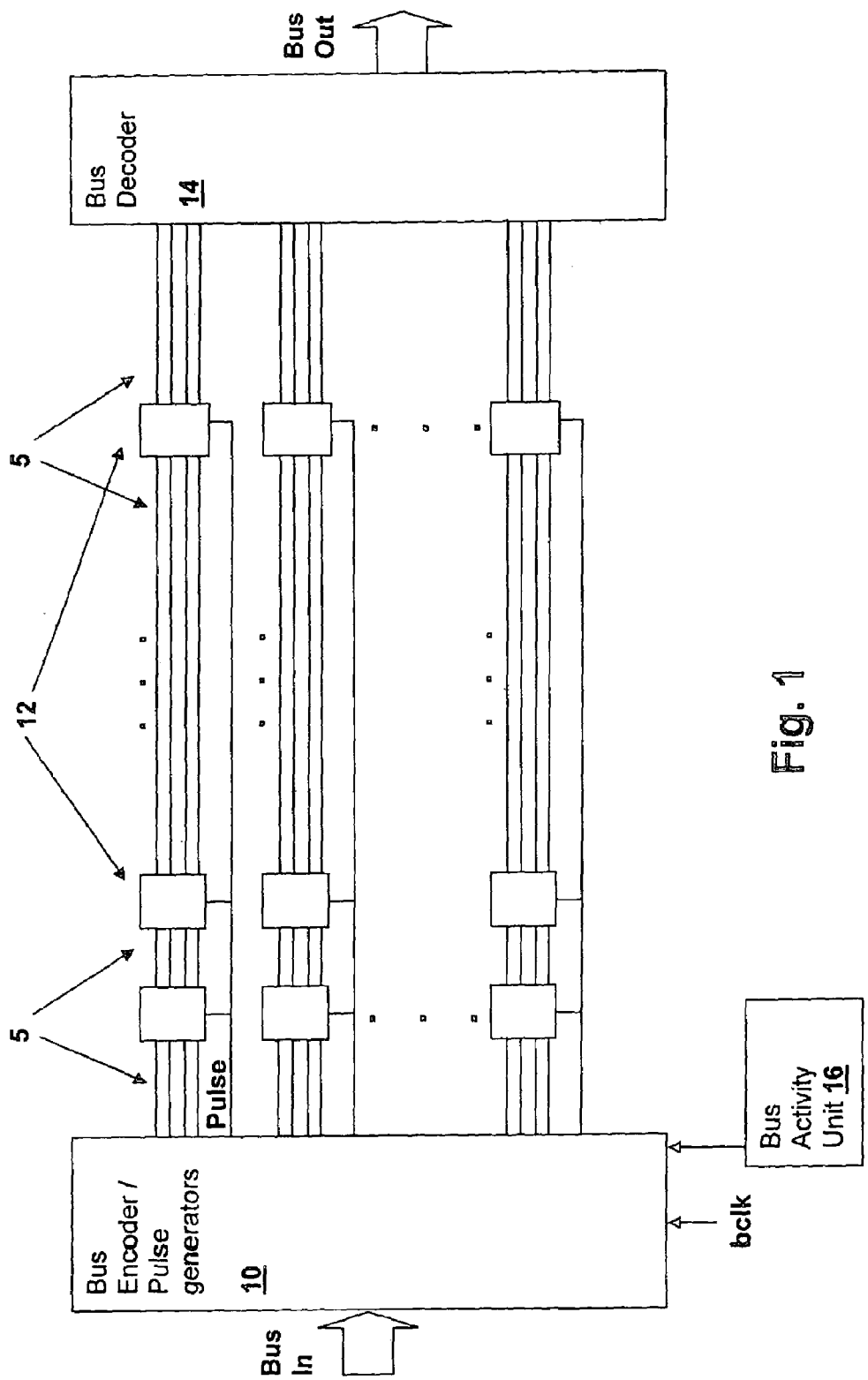
FIG. 1 is a simplified schematic diagram of a bus in accordance with an embodiment of the invention.

With reference now to the figures, and in particular with reference to FIG. 1, there is depicted a block diagram of a bus circuit embodying a method and an apparatus in accordance with the present invention. Bus segments 5 are connected by repeater blocks 12, which are groups of buffers or inverters. Repeater blocks 12 include Multi-Threshold Complementary Metal-Oxide Semiconductor (MTCMOS) repeaters, that have reduced power consumption when in a standby mode. Rather than connect the standby control input of repeater blocks 12 to a global static standby mode control signal (or a local static standby signal in power-partitioned environments), the present invention connects a pulsed signal to the standby inputs of each repeater block 12, achieving a fine-grained power consumption control that minimizes the power consumed by bus repeaters 12.

The pulse signals are generated by pulse generators within Bus Encoder/Pulse Generators block 10, which also includes bus subgroup encoders that convert subgroups of Bus In signals received by the bus circuit to a wider bus group of intermediary bus signals. The bus groups are encoded so that adjacent ones of bus segments 5 do not experience simultaneous opposing logic level transitions. Such encoders are known in the art to reduce the amount of cross-talk between adjacent bus lines and therefore increase the delay margin or delay "slack" available on the bus, as simultaneous opposing transitions on adjacent bus lines will cause a delay in the leading edges of the signals. The pulse signals stay active for a predetermined period, generally an integral number of bus clock cycles, so that the standby mode does not continually cycle during periods of high bus activity. Optionally, a bus activity unit 16 can be provided to control the predetermined period at regular intervals. Bus activity unit 16 can measure the overall bus activity or the activity of each subgroup of bus signals and adjust the pulse period according to the amount of bus activity on either a historical, predicted or system-programmed basis. (Bus activity unit 16 can comprise one or more programmable registers permitting system programming of the predetermined pulse width.)

In the illustrated embodiment, each subgroup of three bus input signals is encoded to four intermediary signals that are applied to bus segments 5 and boosted by repeater blocks 12 as the signals propagate along the bus to a bus decoder 14. Although a three-bit subgroup is illustrated, it should be understood that any suitable subgroup size that can provide reduced cross-talk encoding may be employed. Bus decoder 14 includes a decoder for each subgroup, and provides Bus Out signals that are a delayed version of the Bus In signals provided to Bus Encoder/Pulse generators 10. The illustrated embodiment shows a unidirectional bus, but the techniques of the present invention may be applied equally to bi-directional buses by providing another identical bus circuit having an encoder with inputs connected to the signals shown as Bus Out (in this case bi-directional signals). Similarly a decoder would be provided with outputs connected to the signals shown as Bus In. Because the pulsed standby control signals totally disable repeater blocks 12 when the pulse signals are inactive, logic to prevent overlapping pulse signals from simultaneously enabling repeater groups between common bus segments may be employed. Alternatively, pulse generators may be entirely disabled in one or the other direction by a common control signal. The repeater blocks of the bus circuits for each direction are commonly connected to bus segments 5 and therefor only the repeater group in one direction should be enabled at a given time.

Figure 2:
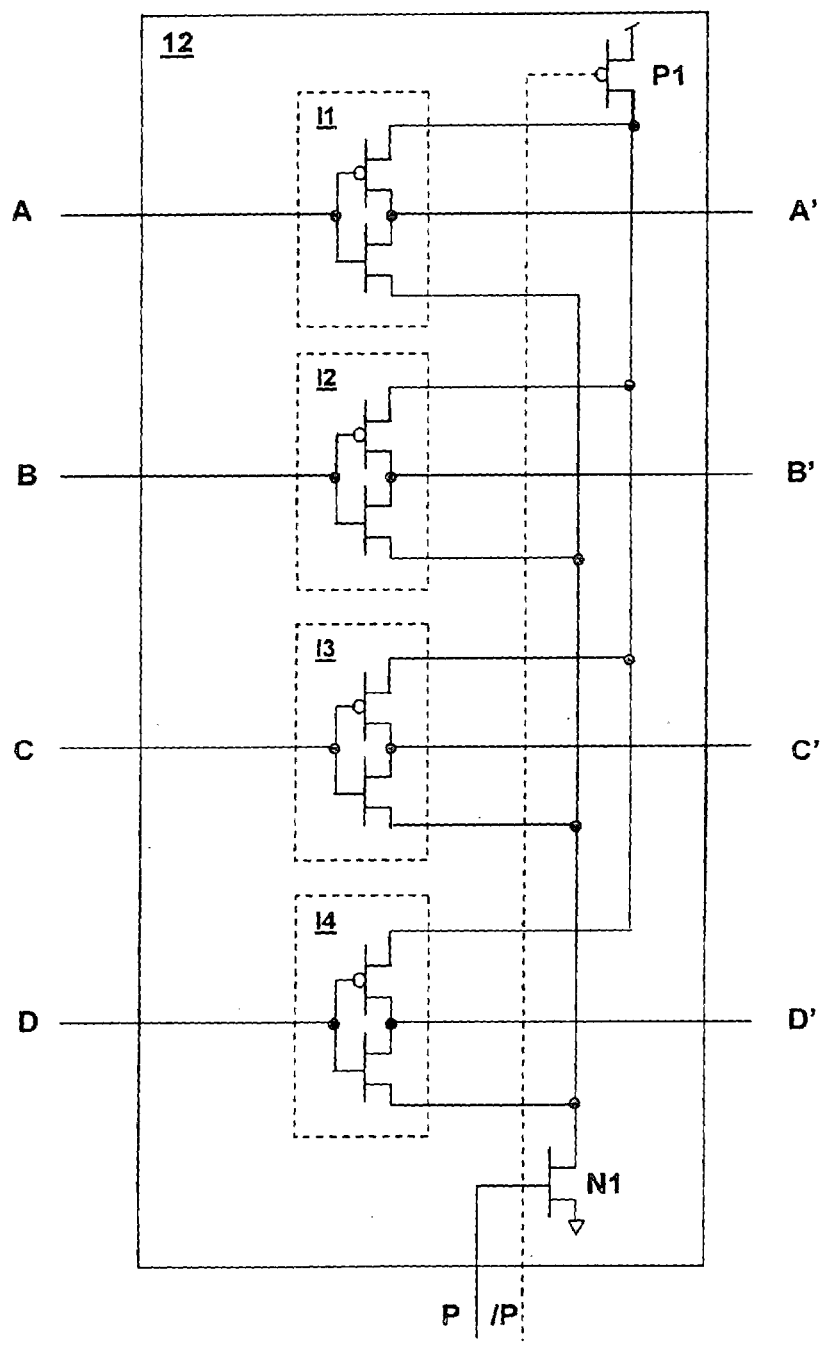
FIG. 2 is a schematic diagram of MTCMOS bus repeater groups 12 of FIG. 1.

Referring now to FIG. 2, details of an MTCMOS repeater group 12 of FIG. 1 are illustrated in a schematic diagram. In the example, the repeaters are inverters I1–I4 and each comprise a P-channel and an N-channel transistor that have a low threshold voltage, generally less than 1 Volt. At least one power supply standby switching device is included, transistor P1, transistor N1 or both, which isolate a "virtual power supply rail" from the actual power supply rail when repeater group 12 is in standby mode. Transistors P1 and/or N1 have much higher threshold voltages, so that when pulse signals P and/or /P are inactive, the leakage through P1 and/or N1 effectively limits the leakage through inverters I1–I4, causing a dramatic decrease in standby mode current—and thus both dynamic and static power consumption by the bus circuit of the present invention. Use of two power supply rail standby switching devices is optional, as pointed out above, but as gate tunneling leakage also contributes to the overall leakage, an improvement in power consumption reduction can generally be achieved-by switching both power supply rails. (Gate-to-source leakage through inverters I1–I4 is substantially decreased by using one switching device, for example transistor N1. However, if only transistor N1 is present, charge can tunnel through the gates of the P-channel devices in inverters I1–I4 when the corresponding bus segment input is in a logical low state.)

The standby mode of repeater group 12 is controlled by pulse signal(s) P and/or /P, which are propagated on parallel bus line(s) alongside bus segments 5. When a pulse is generated for a subgroup of bus signals by a pulse generator within Bus Encoder/Pulse Generators block 10, bus repeater 12 is enabled for at least the time that the detected bus state change has propagated through repeater group 12. By including bus encoding, the delay associated with the encoding assures that pulse signal(s) P and/or /P arrive before corresponding changes in intermediary bus signals A, B, C and D.

While it is preferable to use high threshold devices for the power supply standby switching devices, low threshold devices can also be used to switch the virtual power supply rails. If low threshold devices are used, leakage and consequent power consumption will still be reduced, as the virtual power supply rail(s) will still have a higher leakage impedance to the corresponding actual power supply rail, resulting in decreased leakage current as the voltage across the virtual power supply rails collapses due to leakage (generally to less than 50% of the full power supply voltage). The use of high threshold devices is preferred, but may not be available in al processes. The use of low threshold devices for the standby power switching would either result in more leakage or require in a reduced channel size in order to achieve commensurate leakage reduction. The reduced channel size would increase the on-state impedance of the power supply standby switching devices, resulting in reduced circuit performance.

Figure 3:
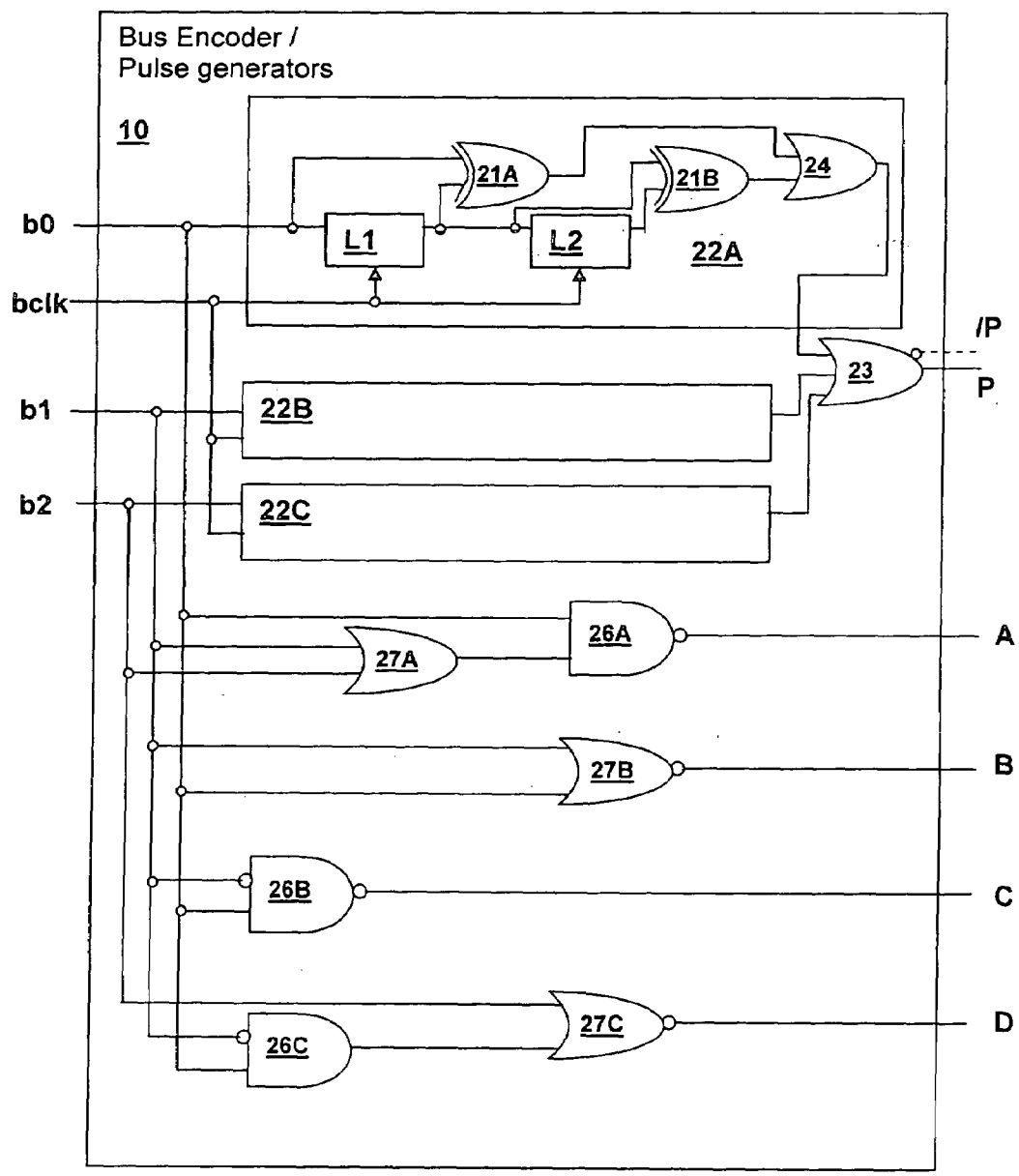
FIG. 3 is a schematic diagram of encoder and pulse generator 10 of FIG. 1.

Referring now to FIG. 3, details of Bus encoder/Pulse generators 10 of FIG. 1 are shown. Each bus input signal b0–b2 is provided to a change detector circuit 22A comprising two latches L1 and L2 that hold the prior two states of the associated input signal. A logical exclusive-OR (XOR) gate 21A compares the corresponding bus input signal's present state with its previous state, and a second XOR gate 21B compares the previous two states to generate a pulse window that has a minimum width of two bus clock cycles as combined by logical-OR gate 24. It should be noted that the count duration may be made adaptive using a history/predictor mechanism so that the pulse hold period adapts to prior or predicted bus activity patterns. The outputs of each change detector 22A–22C for the subgroup is combined in another OR-gate 23 that generates pulse signal P and optionally its complement /P. (It should be noted that local pulse inverters can be used within repeater blocks 12 so that only one bus line is required for the pulse signal, even when a dual rail power supply isolation architecture is employed.)

FIG. 3 shows only one change detector/pulse generator set for one subgroup of bus input signals. However Bus Encoder/Pulse generators 10 of FIG. 1 contains additional identical circuits to that shown in FIG. 3 one for each subgroup.

The encoder portion of Bus Encoder/Pulse generators 10 for each subgroup is shown near the bottom of FIG. 3, and is provided by logical-OR gates 27A–C and logical-AND gates 26A–C, that encode inputs b0, b1 and b2 to produce intermediary bus signals A–D. The encoding follows the table below:

TABLE 1

| Input word $b_2b_1b_0$ | Output Code ABCD |
|---|---|
| 000 | 1111 |
| 001 | 1110 |
| 010 | 1011 |
| 011 | 1010 |
| 100 | 1000 |
| 101 | 0000 |
| 110 | 0011 |
| 111 | 0010 |

The chosen code is the minimum width to achieve crosstalk reduction by avoiding simultaneous opposing transitions on adjacent bitlines, while realizing an advantage over simply inserting shield lines. (A code width of 3 does not provide an advantage over using two bitlines as signal with a shield between.) Intermediary bus signals A–D are physically assigned in order to parallel bus segments 5, so that no opposing transitions occur simultaneously on adjacent bus segments 5.

Figure 4:
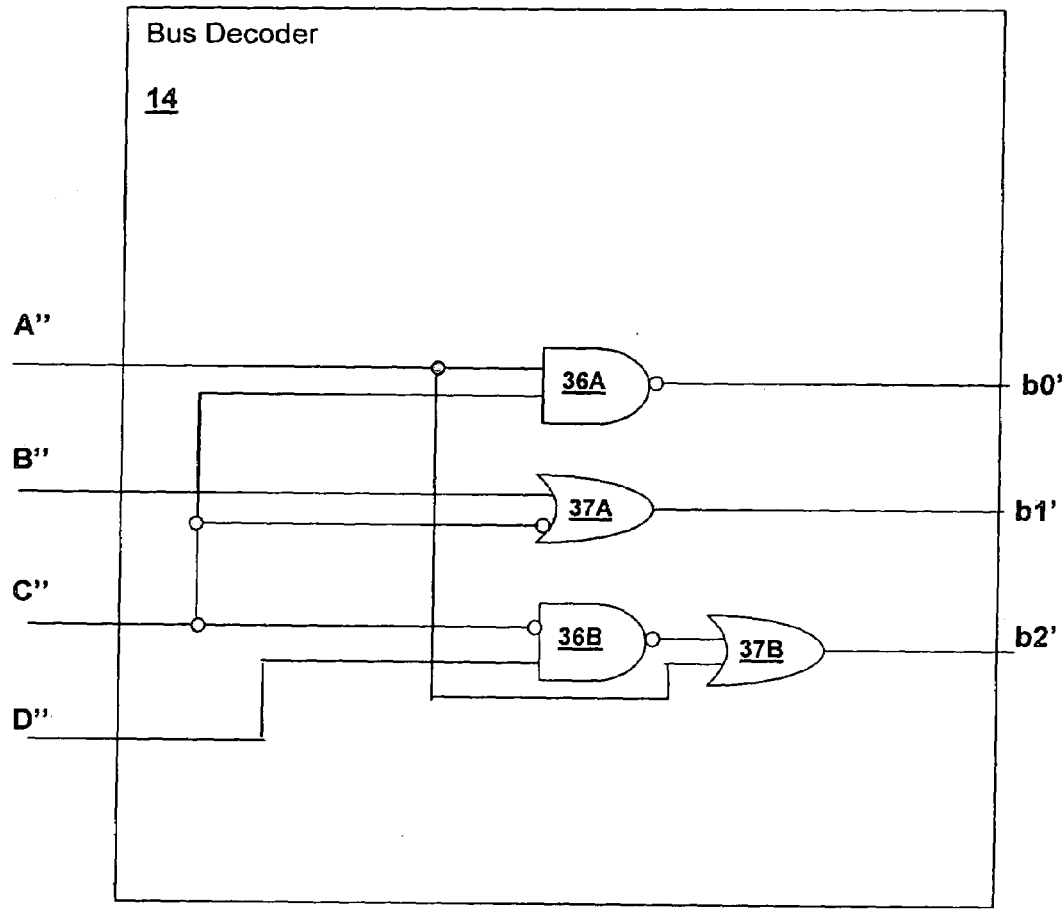
FIG. 4 is a schematic diagram of decoder 14 of FIG. 1.

Referring now to FIG. 4, bus decoder 14 is shown in detail. The final bus segment 5 inputs A"–D" are decoded per Table 1 above by logic comprising logical NAND-gates 36A and 36B, reversing the encoding provided by the encoder portion of Bus encoder/Pulse generators 10.

Figure 5:
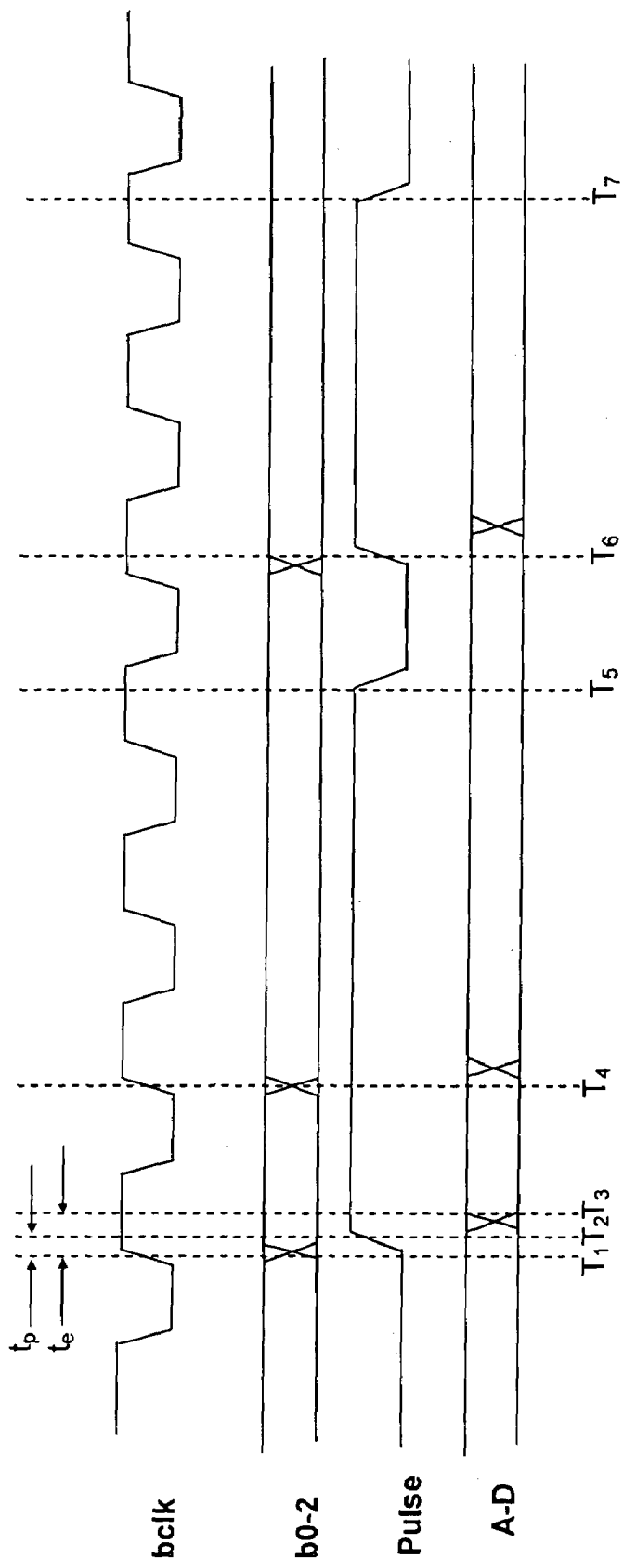
FIG. 5 is a timing diagram depicting the relationship of signals in the bus of FIG. 1.

Referring now to FIG. 5, the timing of signals in the bus circuit of FIG. 1 is depicted. At time $T_1$, the state of bus subgroup input signals $b_0$–$b_2$ changes, triggering one or more of change detectors 22A–C and causing the Pulse signal to activate at time $T_2$. At time $T_3$, the inherent delay of the encoder elapses and intermediary bus signals A–D change state to represent the new combination of input bus signals $b_0$–$b_2$, which then propagate through repeater groups 12 via bus segments 5. At time $T_4$, another state change of input bus signals $b_0$–$b_2$ occurs, causing the Pulse signal to remain active until time $T_5$, which is two bus clock cycles after the most recent transition of the input signal. At time $T_6$, the state of bus subgroup input signals $b_0$–$b_2$ again changes, triggering one or more of change detectors 22A–C and causing the Pulse signal to activate. After two bclk positive transitions have occurred, at time $T_7$, the Pulse signal is de-asserted, illustrating the minimum hold-time period for the Pulse signal of two bclk cycles, preventing a waste of power that may occur due to activation and deactivation of power supply standby switching devices N1 and/or P1 when bus input signals $b_0$–$b_2$ change state every other clock cycle. While a period of two clock cycles has been chosen as the Pulse signal minimum period, it should be understood that other counts can be chosen and can be optimized for a particular tradeoff of virtual power supply rail charging penalties vs. leakage current in the bus repeater circuits.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A bus circuit, comprising:
    a change detector for receiving a plurality of bus input signals and generating an indication in response to detecting a logic level change of any of said bus input signals;
    a pulse circuit for generating a pulse of predetermined duration in response to said indication from said change detector;
    a plurality of bus repeaters for repeating bus signals generated in conformity with said bus input signals, and having at least one common virtual power supply rail node;
    at least one power supply standby control device for selectively applying power to said common virtual power supply rail node in said plurality of bus repeaters responsive to said pulse.

2. The bus circuit of claim 1, further comprising:
    an encoder for receiving said plurality of bus input signals and generating said bus signals as a plurality of intermediary bus signals of greater number than said plurality of bus input signals, whereby said intermediary bus signals represent a coded version of said plurality of bus input signals; and
    a decoder for decoding said plurality of intermediate bus signals at outputs of said plurality of bus repeaters to produce a plurality of bus outputs matching a delayed version of said plurality of bus inputs.

3. The bus circuit of claim 2, wherein said plurality of bus input signals comprises a subgroup of a total plurality of bus input signals divided into subgroups, and wherein said bus circuit comprises a change detector, a pulse generator, an encoder and a decoder for each subgroup, whereby structures of said change detectors, pulse generators, encoders and decoders are simplified, and wherein said bus repeaters associated with each subgroup are activated only in response to said detected logic level change within said associated subgroup of input signals, whereby bus power consumption is further reduced.

4. The bus circuit of claim 3, wherein said subgroup comprises three bus input signals and said encoders generate four intermediary bus signals for each of sad subgroups.

5. The bus circuit of claim 1, further comprising a bus activity unit coupled to said pulse generator for adjusting said predetermined duration in conformity with expected activity of said plurality of bus input signals.

6. The bus circuit of claim 1, wherein said at least one power supply control device has a threshold voltage substantially greater than one or more threshold voltages of devices within said bus repeaters.

7. The bus circuit of claim 1, wherein said at least one common virtual power supply node comprises two virtual power supply nodes and wherein said at least one power supply control device comprises two power supply control devices, one associated with each virtual power supply rail, whereby said repeaters are isolated from both power supply rails when said pulse is inactive.

8. The bus circuit of claim 1, wherein said plurality of bus repeaters comprise a plurality of groups of bus repeaters each of said groups disposed between a pair of bus segments of said bus, one repeater in each group of bus repeaters for repeating a corresponding one of said intermediary bus signals, wherein said groups of bus repeaters are connected in cascade, and wherein said at least one power supply standby control device comprises a plurality of power supply standby control devices each associated with a corresponding one of said bus repeater groups, each of said power supply standby control devices having its control input connected to said output of said pulse circuit along a signal line paralleling a plurality of signal lines carrying said intermediary bus signals, whereby each of said groups of bus repeaters is removed from standby mode at an interval corresponding to arrival of said pulse at a time corresponding with the arrival of said intermediary bus signals at said group of bus repeaters.

9. The bus circuit of claim 1, wherein said pulse generator holds said pulse active until a predetermined number of bus clock cycles has elapsed.

10. The bus circuit of claim 9, wherein said predetermined number of bus cycles is two.

11. The bus circuit of claim 9, wherein each of said change detectors comprises:
a plurality of latches having a clock input connected to a bus clock associated with said plurality of bus input signals, said latches connected in functional cascade; and
a plurality of exclusive-OR gates, each associated with and coupled to a corresponding one of said latches for comparing an input of said associated latch to an output of said associated latch, whereby changes in logical state in said plurality of bus input signals during a number of prior bus clock cycles and a present bus clock cycle is detected, and wherein said pulse generator has an input coupled to said plurality of exclusive-OR gates, whereby said pulse generator is activated while said changes in logical state are detected.

12. A bus circuit, comprising:
a plurality of bus repeaters for repeating intermediary bus signals generated in conformity with a plurality of bus input signals, said plurality of bus repeaters including means for reducing leakage current through said bus repeaters in response to receipt of a control signal disabling said bus repeaters; and
means for enabling said bus repeaters dynamically in response to a change in a state of said plurality of bus input signals, whereby said bus repeaters are active when propagating said intermediary bus signal, and inactive at times when no state change has occurred.

13. The bus circuit of claim 12, further comprising means for providing that said bus repeaters are deactivated after a predetermined time has elapsed subsequent to occurrence of said change in said state.

14. The bus circuit of claim 12, further comprising means for delaying said intermediary bus signals whereby a representation of said change in state is not provided to said bus repeaters until said bus repeaters are active.

15. The bus circuit of claim 14, wherein said means for delaying further comprises means for ensuring that adjacent ones of said intermediary bus signals do not transition in opposing directions simultaneously.

16. A method of operating a bus for transmission of digital signals received as a plurality of bus inputs, comprising:
repeating a representation of said digital signals through a series of bus segments connected via repeaters, wherein said repeaters have a low-power standby mode;
detecting when a change has occurred in said plurality of bus inputs;
in response to detecting said change, enabling said repeaters for a predetermined period after said change has occurred; and
disabling said repeaters after said predetermined period of time has elapsed.

17. The method of claim 16, wherein said repeaters comprise sequentially connected repeaters on said bus and wherein said enabling enable and disable said repeaters by propagating a pulse down a signal path parallel to said bus, whereby said repeaters are activated at different times along the length of said bus.

18. The method of claim 16, further comprising:
encoding said digital signals to produce said representation of said digital signals as a group of signals wherein no simultaneous opposing transition occur on adjacent ones of said bus segments; and
decoding said representation of said digital signals to reconstruct said digital signals upon arrival of said representation of said digital signals at terminals ones of said bus segments.

19. The method of claim 16, wherein said enabling and disabling comprise controlling one or more virtual power supply rail standby switching devices that isolate circuits of said repeaters when said repeaters are disabled, whereby leakage through said repeaters is reduced when said repeaters are disabled.

20. The method of claim 19, wherein said virtual power supply rail standby switching devices have a threshold voltage greater than a second threshold voltage of devices within said repeaters, and wherein said disabling comprises reducing leakage current through said repeaters by providing a control signal having a voltage exceeding said greater threshold voltage to a gate of said virtual power supply rail standby switching devices.

* * * * *